US005638108A

United States Patent [19]

Nacman et al.

[11] Patent Number: 5,638,108

[45] Date of Patent: Jun. 10, 1997

[54] LOWER RESOLUTION LED BARS USED FOR 600 SPI PRINTING

[75] Inventors: Aron Nacman, Rochester; James J. Appel, Brighton; George A. Charnitski, Fairport, all of N.Y.

[73] Assignee: Xerox Corporation, Stamford, Conn.

[21] Appl. No.: 298,700

[22] Filed: Aug. 31, 1994

[51] Int. Cl.[6] .............................. B41J 2/45; H01L 33/00

[52] U.S. Cl. ............................................ 347/238; 257/88

[58] Field of Search .................................. 347/238, 240, 347/234, 130, 132, 131, 40, 206; 257/88, 89

[56] References Cited

U.S. PATENT DOCUMENTS

| | | | |
|---|---|---|---|
| 4,419,679 | 12/1983 | Rutherford et al. . | |
| 4,536,778 | 8/1985 | De Schamphelaere et al. | 347/130 |
| 4,875,057 | 10/1989 | Hediger et al. | 347/238 X |
| 4,916,470 | 4/1990 | Kovacs et al. . | |
| 4,916,530 | 4/1990 | Neilson et al. . | |
| 4,972,270 | 11/1990 | Kurtin et al. . | |
| 5,081,346 | 1/1992 | Narabu et al. . | |
| 5,168,283 | 12/1992 | Hammond et al. . | |
| 5,442,388 | 8/1995 | Schieck | 347/116 |

FOREIGN PATENT DOCUMENTS

| | | | |
|---|---|---|---|
| 54-158232 | 12/1979 | Japan | 347/37 |
| 4-52153 | 2/1992 | Japan | 347/238 |

*Primary Examiner*—Benjamin R. Fuller
*Assistant Examiner*—David Yockey
*Attorney, Agent, or Firm*—Oliff & Berridge

[57] ABSTRACT

A method for achieving high resolution printing using low resolution LED bars is performed by arranging the bars at particular angles to the photoreceptor and timing the activation of the pixels within the LED bars according to the movement of the photoreceptor. In addition, the LED bars may be segmented and arranged so that the segments abut one another at different locations. Each of the abutting segments is disposed at a particular angle to the photoreceptor in the process direction. A lens arrangement is used to image the LED bars.

19 Claims, 8 Drawing Sheets

LOWER RESOLUTION LED BARS USED FOR 600 SPI PRINTING

BACKGROUND OF THE INVENTION

The present invention relates to high resolution LED printing and, more particularly, to a method and apparatus using lower resolution light emitting diode (LED) bars to achieve a high quality printing capability, wherein 600 spot per inch (SPI) printing can be achieved through specially configured 480 SPI and 268.33 SPI LED bars.

Consumer demand in the printing industry calls for high resolution printing. High resolution printing may be achieved through use of LED bars comprising a large number of closely spaced pixels. Inherent problems with closely spaced pixels include the manufacturing difficulties in manufacturing large numbers of wire bonds and the accompanying necessary electronics to drive the increased number of pixels. In addition, there is a limited amount of space within the printer devoted to the LED bars.

U.S. Pat. No. 4,972,270 discloses a method and system for reproducing facsimile images using a staggered array ink jet print head. The ejecters of the print head are selectively fired to accommodate the requirements of a facsimile transmission.

U.S. Pat. No. 4,916,470, the disclosure of which is incorporated herein by reference, discloses use of an image bar in electrophotographic imaging. The number of pixels on the image bar varies from 200 to 2,000. The image bar may possess one row of pixels or a staggered configuration.

U.S. Pat. No. 5,081,346 discloses a solid state imaging device comprised of a plurality of line sensors arranged in a staggered relationship. The imaging device also consists of an array of rod lenses carrying light from a document to the staggered line sensors. A plurality of blocks house the rod lenses and support the line sensors. The blocks are differently configured to accommodate different imaging needs.

U.S. Pat. No. 5,168,283 discloses a printer head wherein two LED arrays are used. A first LED array is used solely for high quality printing at 300–600 SPI. The second LED array is used for low quality background printing. This arrangement allows for the intermittent use of the high quality LED array, thereby prolonging its life.

U.S. Pat. No. 4,916,530 discloses a multiple beam half tone dot generator system using a plurality of LEDs arrayed in staggered rows. The array pattern achieves a high resolution microdot printing. The LED array is composed of four staggered rows of six LEDs in each row.

U.S. Pat. No. 4,419,679 discloses a recording head for use in an electrostatic printer. The recording head is comprised of four staggered rows of styli. Signals for driving each row of styli are staggered and driven by a random access memory. This arrangement results in a line printing capability that reduces the noise frequency of each line and also reduces spurious discharge across the insulation between the styli to provide better image quality.

SUMMARY OF THE INVENTION

It is an object of the present invention to improve on conventional techniques of using LED bars in high resolution printing.

It is another object of the present invention to provide arrangements for use of 480 SPI and 268.33 SPI LED bars in achieving 600 SPI quality printing.

These and other objects are achieved by providing a method and apparatus for obtaining high resolution printing using low resolution LED bars within a printer. The method includes the steps of arranging an LED bar within a printer at a predetermined angle to a photoreceptor in a process direction, arranging individual pixels on the LED bar such that they are a predetermined distance from one another, and simultaneously imaging all the pixels of the LED bar once for every 1/600th of an inch the photoreceptor moves.

The pixels are spaced about 1/424.26th of an inch apart within the LED bar and have a spot size of about 42.3 microns.

In accordance with another aspect of the invention, a method is provided for obtaining high resolution printing using low resolution LED bars within a printer. The method includes the steps of segmenting an LED bar into segments, and arranging the segments at 45° to the photoreceptor in a process direction.

In still another aspect of the invention, a high resolution LED printer is provided having a photoreceptor. The printer includes an LED bar disposed at a predetermined angle to the photoreceptor in a process direction. The LED bar includes individual pixels arranged at a predetermined distance from one another. A lens arrangement is preferably used to image the arranged segments.

BRIEF DESCRIPTION OF THE DRAWINGS

These and other aspects and advantages of the present invention will become apparent from the following detailed description of preferred embodiments when taken in conjunction with the accompanying drawings, in which.

DETAILED DESCRIPTION OF PREFERRED EMBODIMENTS

The following detailed description is applicable to numerous printing systems as would be contemplated by those of ordinary skill in the art.

It is common to use light emitting diode (LED) bars in printing devices. LED bars provide reliable and controllable light sources. The bars are generally comprised of a plurality of light sources, i.e., pixels that can be activated and deactivated (pulsed) to emit short bursts of light at a high rate of speed. Each light burst is used to create a particular portion of a printed symbol or character. The more often a pixel is pulsed, the more often a symbol or character portion will be imaged, thus providing greater detail and higher resolution printing. Therefore, for the printing to be completed within a commercially reasonable time with high resolution, it is necessary to have a high rate of pulsing.

LED bars are manufactured in different segment, or chip, sizes. Segment size depends on the number of pixels within the segment. Two popular numbers of pixels per segment are 64 pixels and 128 pixels. At 424.26 spi these segments would be 3.832 and 7.663 mm respectively. The respective lengths are determined by dividing the number of pixels by the spot per inch requirement and converting the quotient to millimeters. For example:

$$64(\text{pixels}) \times \frac{1}{424.26(\text{spi})} = .1509\ \text{in} \times 25.4\ \frac{\text{mm}}{\text{in}} = 3.832\ \text{mm}$$

$$128(\text{pixels}) \times \frac{1}{424.26(\text{spi})} = .3017\ \text{in} \times 25.4\ \frac{\text{mm}}{\text{in}} = 7.663\ \text{mm}$$

Figure 1:
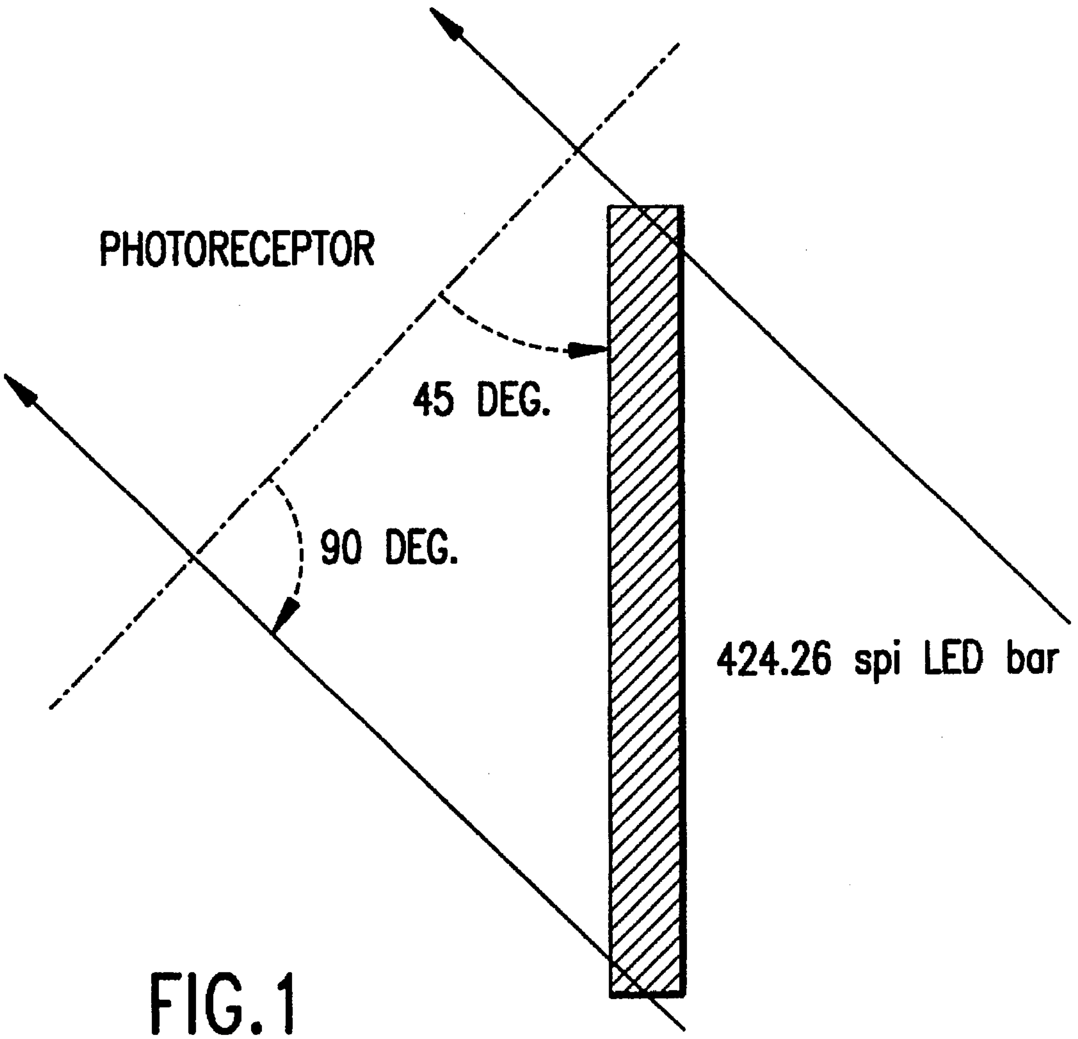
FIG. 1 depicts an LED bar arranged at an angle to a photoreceptor.

When an LED bar is disposed at an angle relative to the process direction, the effective spacing between the pixels is narrowed, thereby effectively increasing the printing resolution. A first embodiment of the invention shown in FIG. 1 illustrates a 424.26 SPI bar mounted at a 45° angle to the photoreceptor to provide an image at 600 SPI. As FIG. 1 further illustrates, a right triangle is formed with a photoreceptor leg and LED bar hypoteneuse. The length of a hypoteneuse for a 45-45-90 triangle is $$((\sqrt{2}) \times a)$$

wherein "a" is the length of a leg. At 45°, the effective space between each of the pixels is 1/600th of an inch. Therefore, $$\sqrt{2} \times \frac{1}{600(\text{in})} = .00357(\text{in}) = \frac{1}{424.26(\text{in})} = 424.26(\text{spi}).$$

Figure 2:
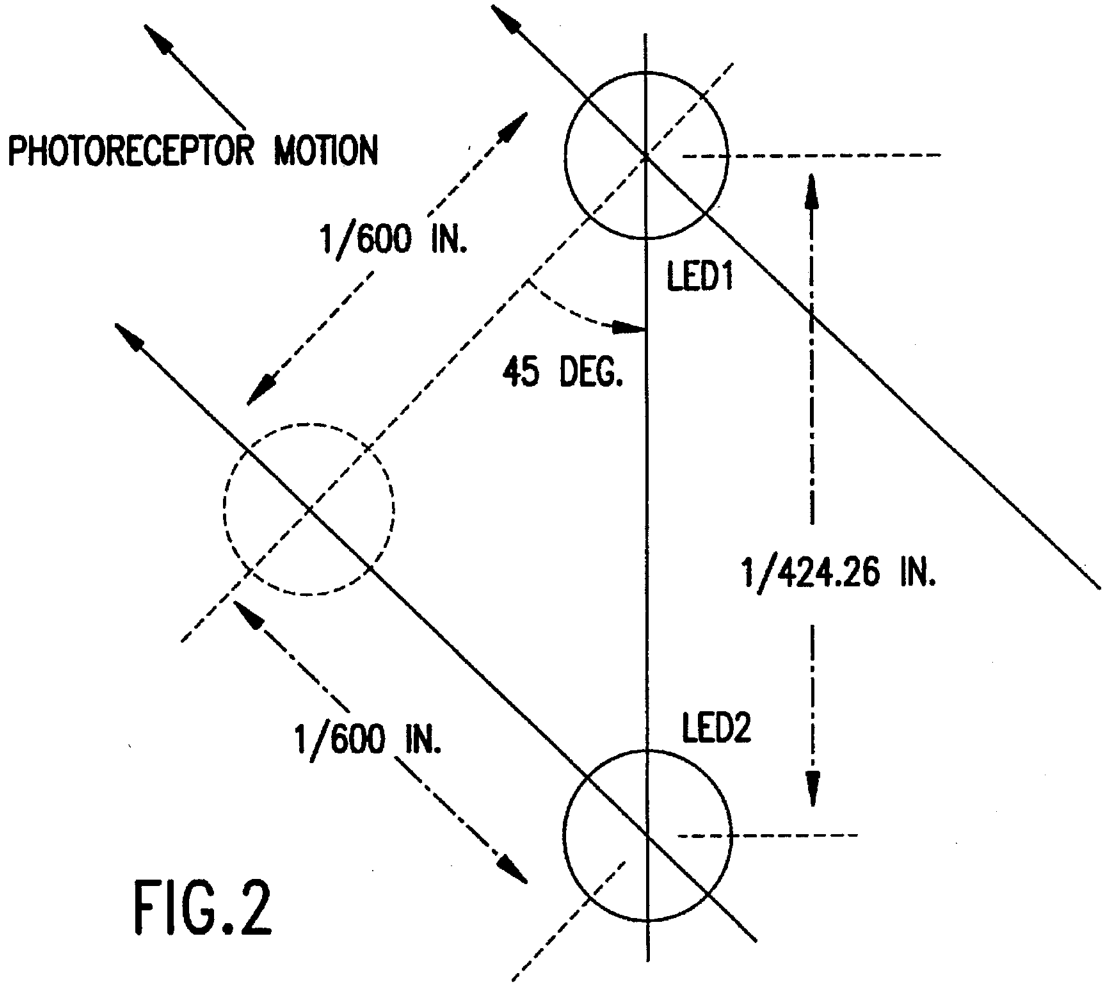
FIG. 2 shows the spacings of pixels of an LED bar.

As illustrated in FIG. 2, the 45° angle provides this resolution in both the process and cross process directions. With this configuration, the LED bar is activated to provide an image every time the photoreceptor moves 1/600th of an inch. Because the pixels cannot be imaged individually, the LED bar has to remain at 45°. If it were possible to image the pixels individually, then the angle would become arbitrary.

Figure 3:
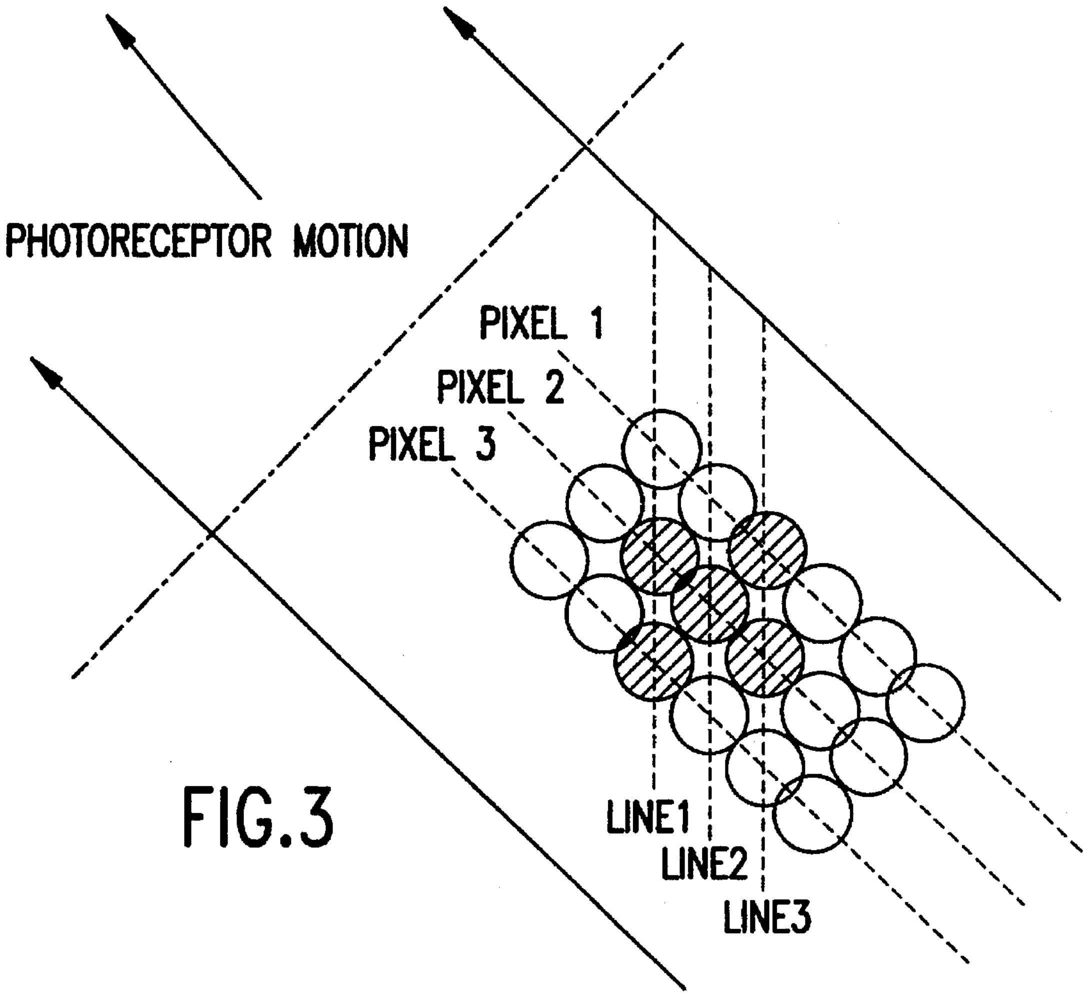
FIG. 3 shows an example of how LED imaging works.

FIG. 3 shows an imaging technique using a 3 row LED bar. In this figure, a "plus" sign is created using 3 by 3 activated pixels. The darkened spots indicate an active pixel. When line 1 is imaged, LED pixels 2 and 3 are activated. When line 2 is imaged, only LED pixel 2 is activated. When line 3 is imaged, LED pixels 1 and 2 are activated.

The correct spot size for 600 SPI printing is 42.3 microns. Spot size is measured at the FWHM (Full Width at Half Maximum) of the exposure distribution. At 42.3 pm, FWHM, the spot size is equal to the spot spacing and the exposure uniformity is optimized. As shown in FIG. 2, spacing between the pixels is 1/424.26th of an inch or 59.9 μm. This value is critical to maintain the proper spacing in both the process and cross process directions.

Figure 4:
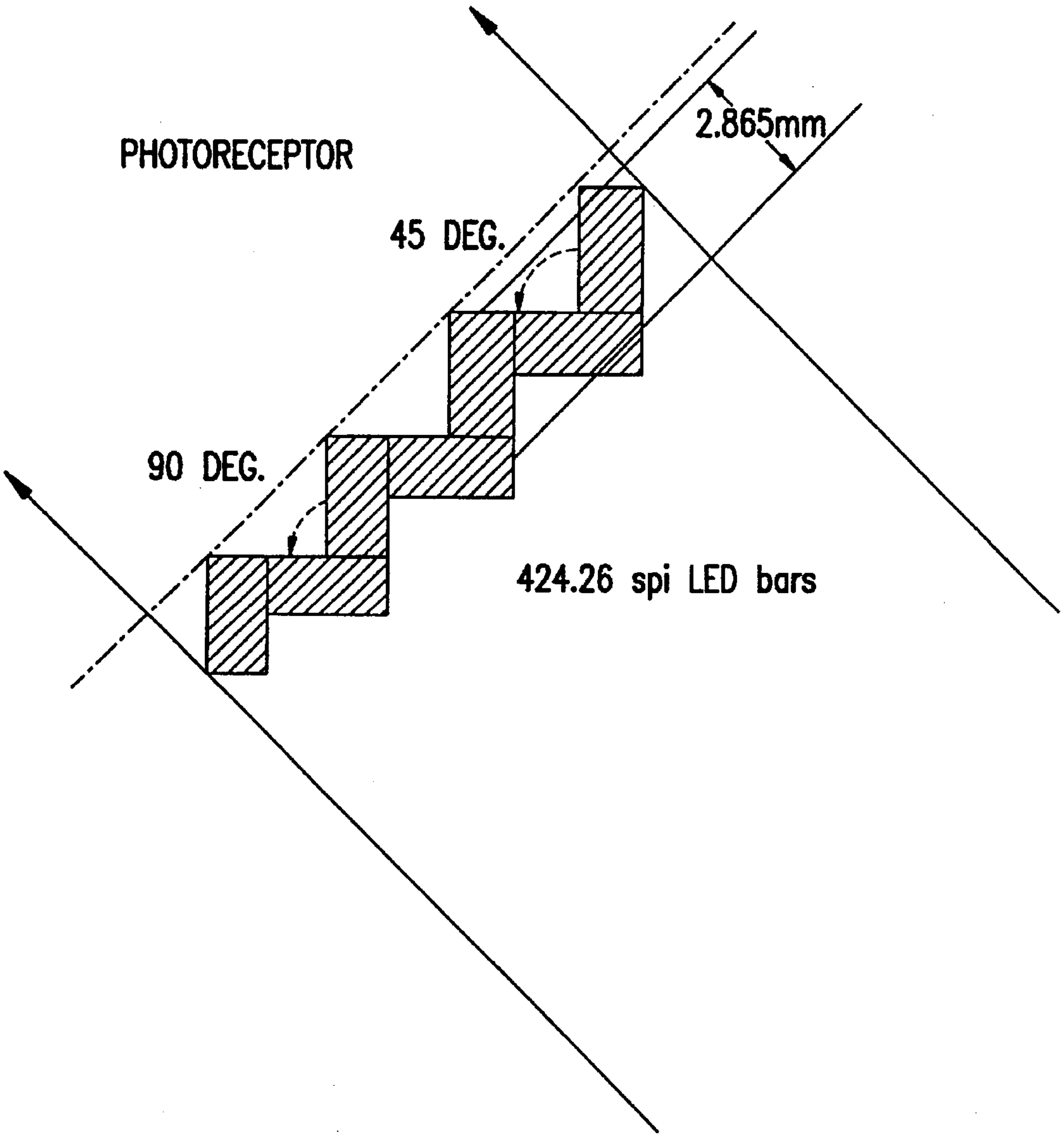
FIG. 4 shows a staggered arrangement of LED chips.
Figure 5:
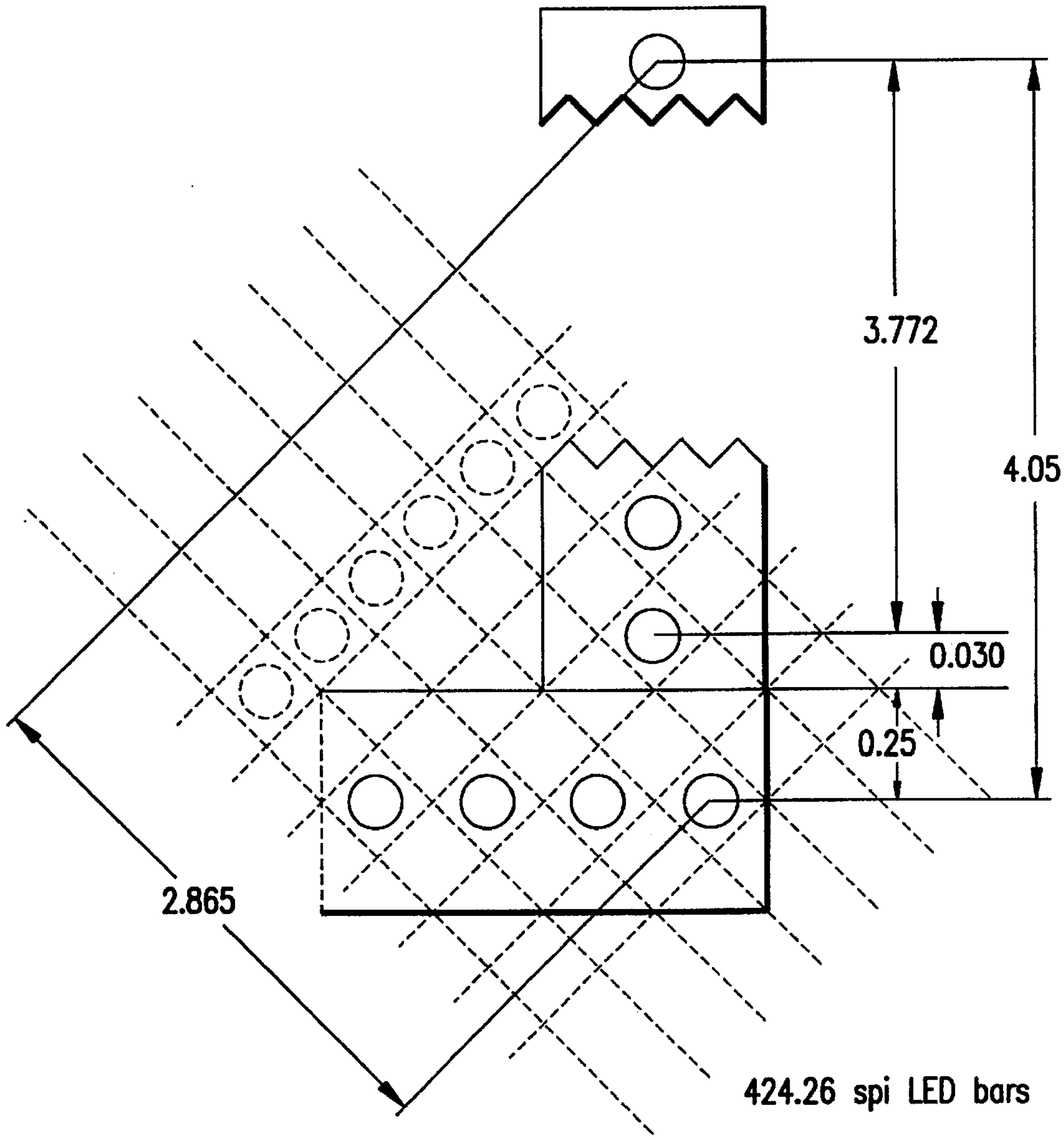
FIG. 5 is a graphical representation of the pixel spacing according to the staggered arrangement.

In an effort to reduce the length required to implement the above-described first embodiment and to reduce the amount of photoreceptor usage, a second embodiment, illustrated in FIGS. 4 and 5, provides a staggered LED bar, wherein each segment of the bar is disposed at 45° to the process direction. The process direction is indicated by arrows as shown. The segments are arranged perpendicular to and abut an end of an adjacent segment. Each segment is 3.832 mm in length, assuming a 64 pixel chip at 424.26 SPI spacing.

Figure 6:
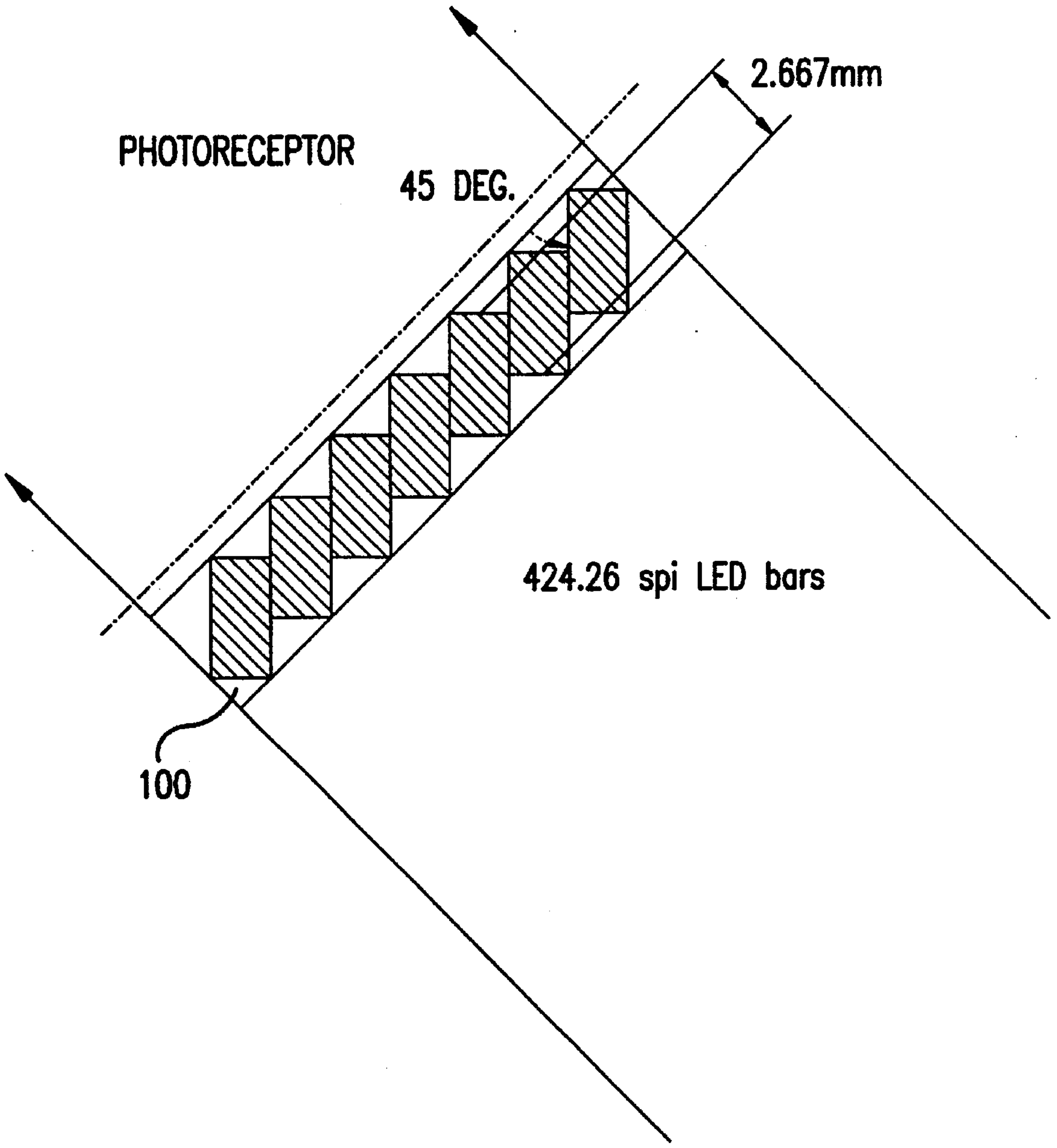
FIG. 6 illustrates a second embodiment of a staggered arrangement.
Figure 7:
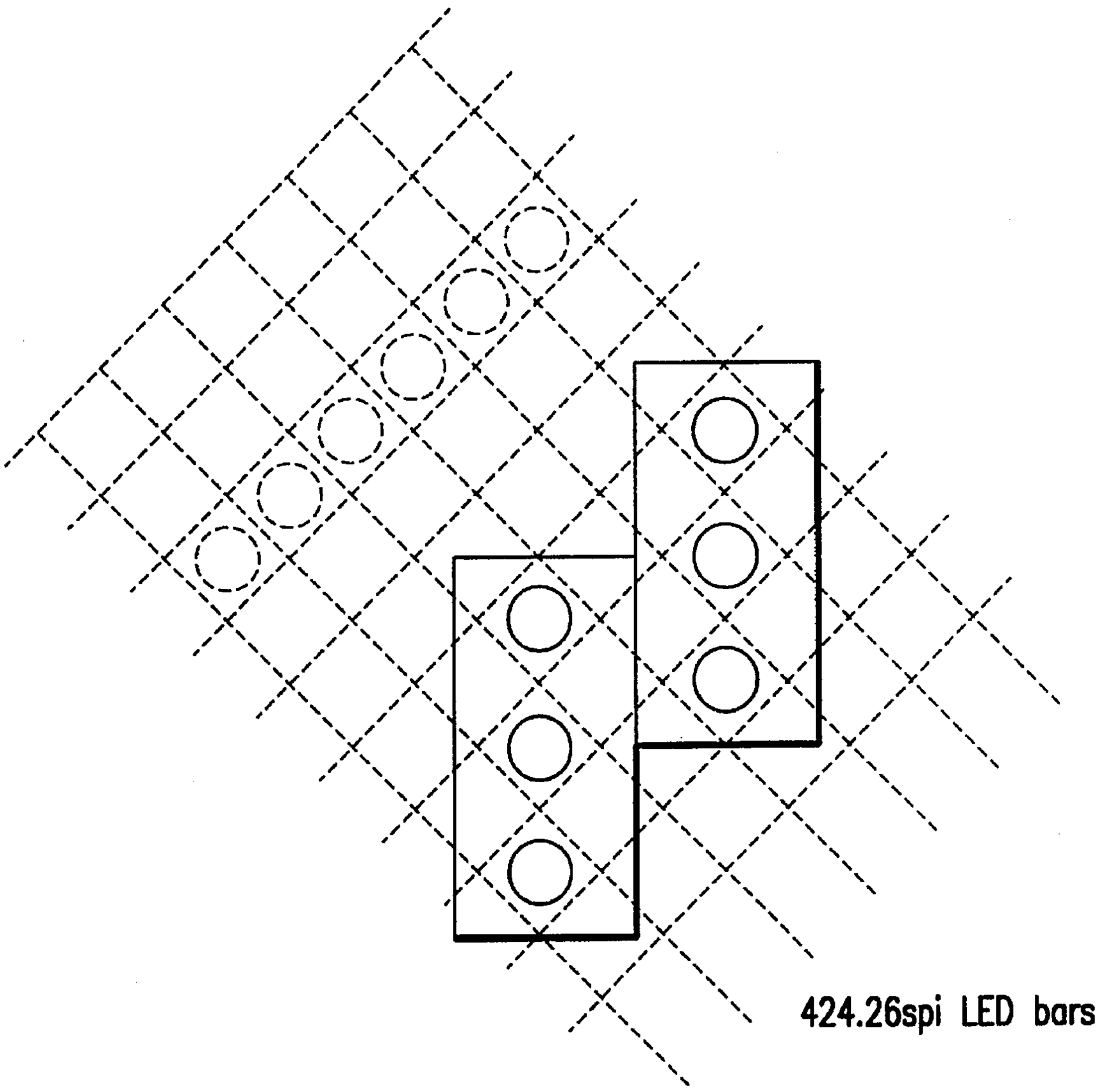
FIG. 7 is a graphical representation of the pixel spacing according to the second LED bar staggered arrangement.

FIG. 6 illustrates a third embodiment of the invention. In FIG. 6, an LED bar is segmented in pieces 3.832 mm in length. Each segment of the bar is aligned at 45° to the process direction. Each segment is arranged perpendicular to and situated midway along a side of an adjacent segment. FIG. 7 shows the alignment of the pixels from the embodiment of FIG. 6.

All three embodiments use a single SELFOC lens, as shown, for example, in FIG. 6 designated by reference numeral 100, to image the staggered LED bars. In the second and third embodiments the field of view of the lens will have to cover a field of 2.865 mm, as shown in FIG. 4, and 2.677 as shown in FIG. 6. The calculation for the field of view shown for the embodiment of FIG. 4 is shown in FIG. 5. It is necessary for the field of view to encompass all the pixels within its area. The diameter of the field of view must therefore run the distance between the midpoint of the lowermost and uppermost pixel. FIG. 4 demonstrates this length being 4.052 mm. As the LED bar segments form 45-45-90 triangles, geometry dictates that the field of view must be 2.865 mm. This field of view can be achieved through use of a two row SLA20 SELFOC lens. In addition, alternative lens arrangements as known to those skilled in the art may be used.

Figure 8:
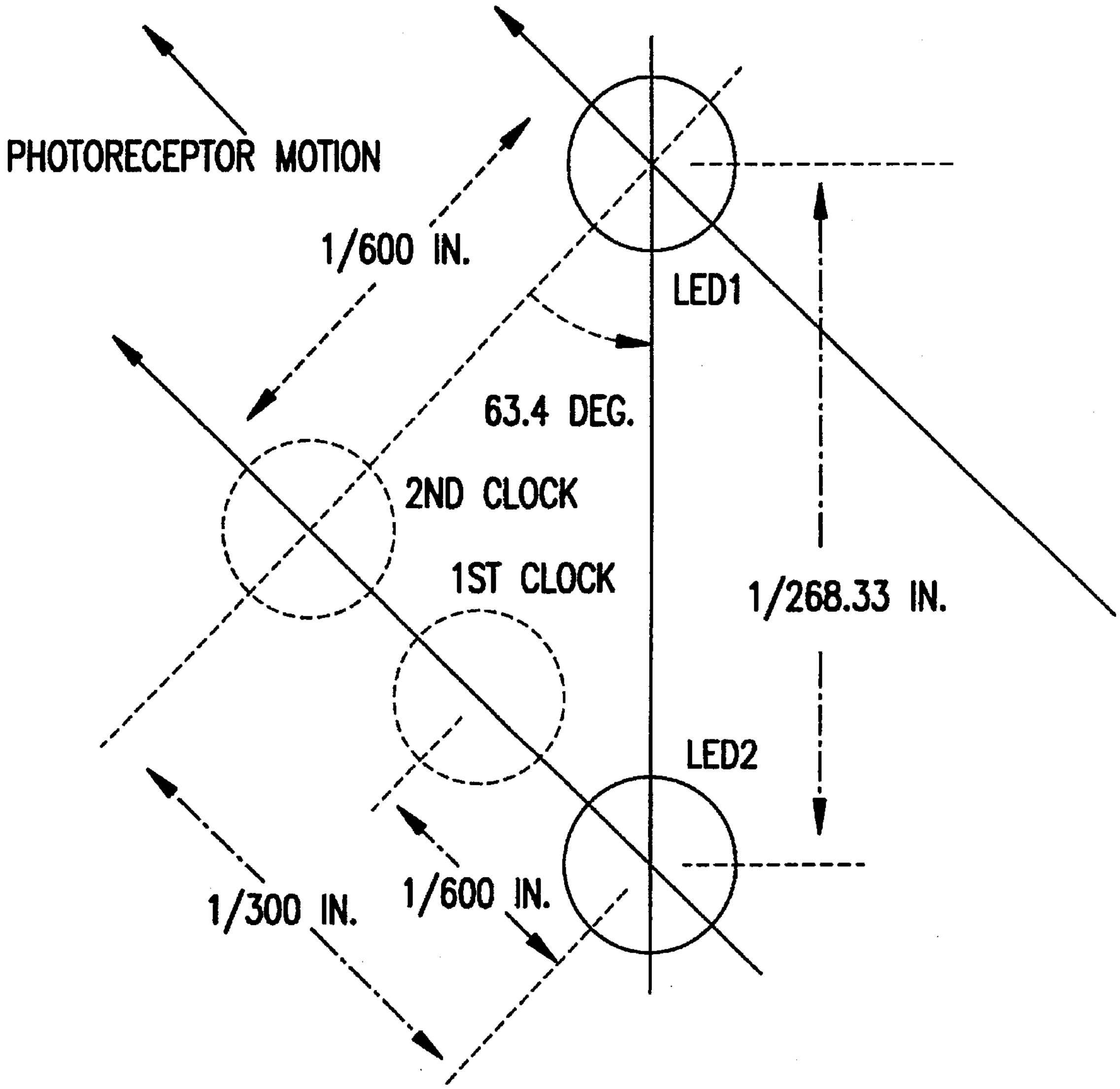
FIG. 8 illustrates a configuration using LED chips at a steep angle to the photoreceptor.

A fourth embodiment of the invention is illustrated in FIG. 8. A 268.33 SPI LED bar is used at an angle of 63.4° to the photoreceptor. By pulsing the bar each time the photoreceptor moves 1/600th of an inch, 600 SPI resolution is achieved. The bit map of the printer is appropriately organized to accommodate the steeper tilt angle and pulse rate.

The SELFOC lens field of view, assuming 64 pixels/chip, and the staggered configurations of FIGS. 4 and 6 at the 63.4° angle would be about 5.60 mm in this embodiment. The lens arrangement is not limited to the above embodiments, and the invention is intended to encompass any equivalent arrangement known in the art.

To correct astigmatic imperfections associated with the edges of the field of view, correction of the power or exposure time of the pixels located near the edge of the field of view is performed. Correction generally takes the form of increased power with respect to pixels located toward the center of the field of view. However, correction is not limited to this method.

While the embodiments disclosed herein are preferred, it will be appreciated from this teaching that various alternatives, modifications, variations or improvements therein may be made by those skilled in the art that are within the scope of the invention, which is defined by the following claims.

What is claimed is:

1. A method of arranging a low resolution LED bar within a printer so as to allow high resolution printing, the method comprising the steps of:

segmenting an LED bar into segments, each of the segments having two sides and two ends; and arranging each of the segments at 45° to a photoreceptor of the printer in a process direction such that at least one of the sides of each of the segments is disposed adjacent to one of the sides of at least one abutting segment so that one of the ends of each of the segments is located at a midway point of the one of the sides of the abutting segment.

2. A method according to claim 1, wherein the segments are each chip.

3. A method according to claim 2, wherein each chip is of 424.26 SPI.

4. A method according to claim 2, wherein each chip includes 64 pixels.

5. A method according to claim 4, wherein each chip is 3.832 mm in length.

6. A method according to claim 1, including imaging the arranged segments with a lens arrangement.

7. A method according to claim 6, wherein the lens arrangement is comprised of a single gradient index lens.

8. A method according to claim 7, wherein a field of view of the lens arrangement is 2.709 mm.

9. A method according to claim 6, wherein the lens arrangement is composed of a two-row gradient index lens.

10. A high resolution printer having a photoreceptor, the printer comprising a plurality of LED bar segments arranged end to end, said segments abutting one another at a substantially perpendicular angle, wherein the segments are disposed at a predetermined angle to a photoreceptor in a process direction.

11. An apparatus according to claim 10, wherein each of the segments is chip.

12. An apparatus according to claim 11, wherein each chip includes 64 pixels.

13. An apparatus according to claim 11, wherein each chip is at 424.26 spots per inch.

14. An apparatus according to claim 13, wherein each chip is 3.832 mm in length.

15. An apparatus according to claim 10, further comprising a lens arrangement located between the segments and the photoreceptor for imaging the segments.

16. An apparatus according to claim 15, wherein said lens arrangement is comprised of a single cell focusing lens.

17. An apparatus according to claim 15, wherein said lens arrangement is composed of a two row focusing lens.

18. An apparatus according to claim 15, wherein the field of view of said lens arrangement is about 2.709 mm.

19. A high resolution LED printer having a photoreceptor, the printer comprising a plurality of LED bar segments, each of the LED bar segments having two sides and two edges, at least one of the sides of each of the LED bar segments being arranged along a side of an abutting LED bar segment such that at least one of the edges of the at least one of the LED bar segments is located at a midway point of the side of the abutting LED bar segment, wherein the plurality of segments are disposed at 45° to the photoreceptor in a process direction.

* * * * *